(12) United States Patent
Elmer et al.

(10) Patent No.: US 10,649,102 B2
(45) Date of Patent: May 12, 2020

(54) CONCENTRIC SEMI-CIRCULAR SPLIT PROFILING FOR COMPUTED TOMOGRAPHIC IMAGING OF ELECTRONIC BEAMS

(71) Applicant: LAWRENCE LIVERMORE NATIONAL SECURITY, LLC, Livermore, CA (US)

(72) Inventors: John W. Elmer, Danville, CA (US); Alan T. Teruya, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 69 days.

(21) Appl. No.: 16/123,069

(22) Filed: Sep. 6, 2018

(65) Prior Publication Data

US 2020/0081143 A1 Mar. 12, 2020

(51) Int. Cl.
*G01T 1/29* (2006.01)
*H01J 37/244* (2006.01)
(52) U.S. Cl.
CPC .......... *G01T 1/2985* (2013.01); *H01J 37/244* (2013.01)
(58) Field of Classification Search
CPC ..................................................... H01J 37/244

USPC .......................................................... 250/397
See application file for complete search history.

(56) References Cited

U.S. PATENT DOCUMENTS

| 7,288,772 | B2 | 10/2007 | Elmer et al. |
| 7,348,568 | B2 | 3/2008 | Elmer et al. |
| 8,791,426 | B2 | 7/2014 | Elmer et al. |
| 9,105,448 | B2* | 8/2015 | Elmer ................. H01J 37/244 |
| 2010/0032562 | A1* | 2/2010 | Teruya ................. H01J 37/244 250/305 |
| 2015/0129774 | A1* | 5/2015 | McAninch ......... G01R 19/0061 250/397 |

* cited by examiner

*Primary Examiner* — Yara B Green
(74) *Attorney, Agent, or Firm* — Eddie E. Scott

(57) ABSTRACT

Apparatus and method for analyzing an electron beam including a circular sensor disk adapted to receive the electron beam, an inner semi-circular slit in the circular sensor disk; an outer semi-circular slit in the circular sensor disk wherein the outer semi-circular slit is spaced from the first semi-circular slit by a fixed distance; a system for sweeping the electron beam radially outward from the central axis to the inner semi-circular slit and outer second semi-circular slit; a sensor structure operatively connected to the circular sensor disk wherein the sensor structure receives the electron beam when it passes over the inner semi-circular slit and the outer semi-circular slit; and a device for measuring the electron beam that is intercepted by the inner semi-circular slit and the outer semi-circular slit.

23 Claims, 8 Drawing Sheets

CONCENTRIC SEMI-CIRCULAR SPLIT PROFILING FOR COMPUTED TOMOGRAPHIC IMAGING OF ELECTRONIC BEAMS

STATEMENT AS TO RIGHTS TO APPLICATIONS MADE UNDER FEDERALLY SPONSORED RESEARCH AND DEVELOPMENT

The United States Government has rights in this Applications pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to Tomographic Imaging of Electron Beams and more particularly to Concentric Semi-Circular Slit Profiling for Computed Tomographic Imaging of Electron Beams.

State of Technology

This section provides background information related to the present disclosure which is not necessarily prior art.

U.S. Pat. No. 8,791,426 for electron beam diagnostic System using computed tomography and an annular sensor, provides the state of technology information described below.

Electron beams are considered to be the most precise and clean method available for welding thick sections of materials. Unfortunately, electron beams suffer one critical deficiency, namely the repeat-ability of focusing the beam to a known power density. Without the ability to reliably reproduce the power distribution in an electron beam, weld quality cannot be guaranteed. This problem is exacerbated by the fact the many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method utilizes a modified Faraday cup.

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

Applicant's apparatus, systems, and methods provide improvements for analyzing electron beams using an annular sensor to measure electron beam profiles. One improvement is the incorporation of two or more concentric semi-circular arc slits that allow precise timing of the beam scan speed. Precise timing of the beam scan speed is required for accurate reconstruction and analysis of the electron beam power density distribution. Multiple concentric slits also allow for beam averaging since more than one data point is acquired for each scan direction.

Applicant's apparatus, systems, and methods also provide improvements that allow for both outward and inward sweeping of the beam over a given slit. Outward and inward sweeping of the beam over a given slit provides computed tomography to reconstruct and analyze beam profiles. The outward and inward sweeping of the beam over a given slit enables the system to acquire beam profiles both at a given angle going out, and at a second angle when coming back in. The second angle, acquired when sweeping inward provides information 180 degree from a corresponding angle sweeping out, which provides a full set of data over 180 degree sweep angle. The two concentric slits allow for precise measurement of the beam's velocity knowing the spacing between the slits, while at the same time profiling the beam for computed tomographic analysis.

Applicant's apparatus, systems, and methods have use in computed tomography to reconstruct and analyze the power density distribution in high power electron beams often used for welding. Measuring the power density distribution of high power electron beams is essential for providing quality control in welding and other electron beam processing techniques. For example, knowing how the electron beam parameters affect the power density distribution of the beam can be used to determine the focus conditions high power electron beams, can provide high resolution analysis of electron beams, can be used to transfer electron beam parameters between machines and facilities, can be used to develop better electron beam gun designs, and can be used as essential information for modeling electron beam interactions with materials.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Figure 1A:
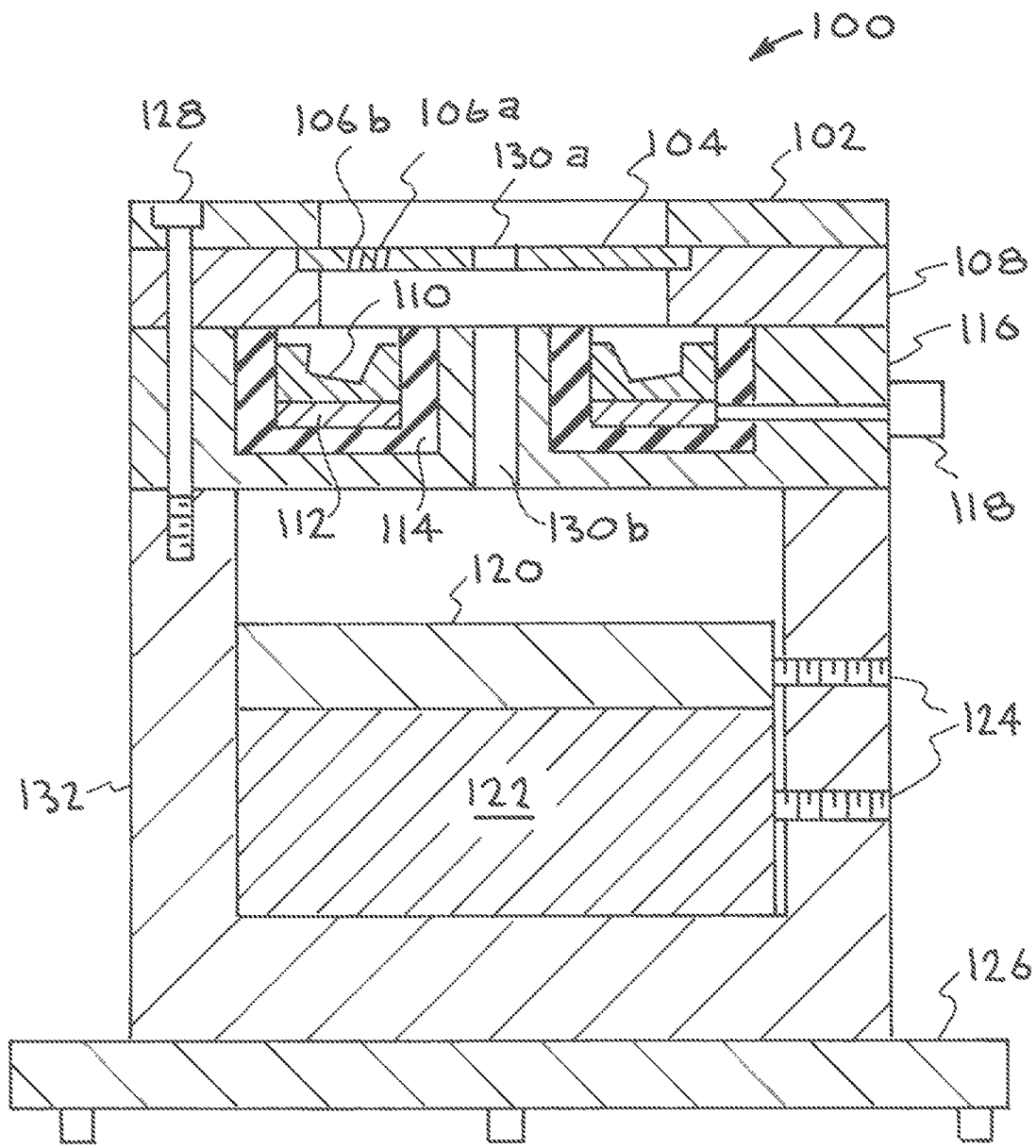
FIG. 1A is a cross sectional view of Applicant's electron beam diagnostic annular sensor system.

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

Figure 1B:
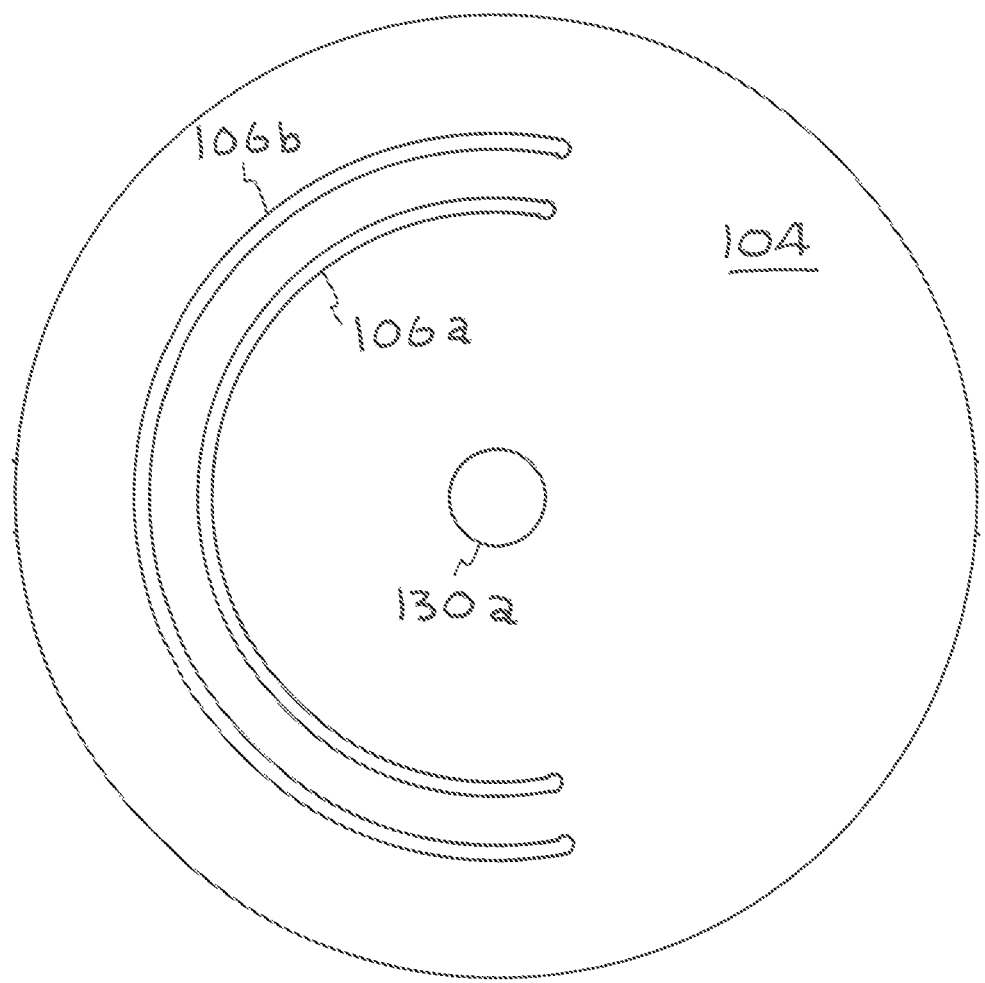
FIG. 1B is a top view of the slit disk of Applicant's electron beam diagnostic annular sensor system.

Referring now to the drawings, and in particular to FIG. 1A and FIG. 1B, one embodiment of Applicants' concentric semi-circular slit profiling apparatus, systems, and methods for computed tomographic imaging of electron beams is illustrated. This first embodiment is designated generally by the reference numeral 100. FIG. 1A is a cross sectional view of Applicants' concentric semi-circular slit profiling apparatus 100. FIG. 1B is a top view of the concentric semi-circular slit profiling slit disk 104 shown in FIG. 1A.

As illustrated in FIG. 1A, the embodiment 100 includes a number of components. The components of the Applicant's concentric semi-circular slit profiling apparatus 100 illustrated in FIG. 1A are identified and described below.

Reference Numeral 102—top clamp,
Reference Numeral 104—slit disk,
Reference Numeral 106a—inner semi-circular slit,
Reference Numeral 106b—outer semi-circular slit,
Reference Numeral 108—slit disk holder,
Reference Numeral 110—Faraday cup,
Reference Numeral 112—Faraday cup beam stop,
Reference Numeral 114—Faraday cup electrical insulator,
Reference Numeral 116—beam trap body,
Reference Numeral 118—insulated electrical connector,
Reference Numeral 120—beam stop absorber,
Reference Numeral 122—beam stop,
Reference Numeral 124—set screws,
Reference Numeral 126—tripod leveling base,
Reference Numeral 128—top clamp screws,
Reference Numeral 130a—hole in slit disk,
Reference Numeral 130b—hole in beam trap body, and
Reference Numeral 132—lower cup body.

FIG. 1A provides a cross sectional view of the electron beam diagnostic annular sensor system 100. There is a lower cup body 132 upon which are mounted the beam trap body 116, top clamp 102 and the Faraday cup unit 110. Electrical isolation 114 electrically isolates the Faraday cup unit 110 from the other items. The Faraday cup 110 is where the signal or data is collected and is connected to the data acquisition system through the insulated electrical connector 118. There is an electron beam source connected to an electron beam controller.

Referring now to FIG. 1B, a top view of the slit disk 104 of FIG. 1A is shown. The slit disk 104 is a two-slit configuration that includes inner semi-circular slit 106a and outer semi-circular slit 106b. The inner semi-circular slit 106a and outer semi-circular slit 106b cover about 200 degrees of arc on the circumference, insuring that the centroid of a wide beam can be analyzed over at least 180 deg on the outward scan, and 180 deg on the inward scan.

Applicant's first embodiment of a concentric semi-circular slit profiling apparatus 100 utilizes inner semi-circular slit 106a and outer semi-circular slit 106b that cover about 200 degrees of arc on the circumference; however, it is to be understood that in other embodiments the inner semi-circular slit and the outer semi-circular slit cover less than 360 deg so that the inner part of the slit disk is attached to the outer portion. In the embodiment 100, Applicants keep it closer to 200 deg to give it additional strength and stability as possible; however, if it was 240 deg, for example, Applicant's concentric semi-circular slit profiling apparatus would work just fine.

There is a hole 130 in the center of the slit disk 104 that allows the beam to pass through the disk and onto the beam stop. The electron or ion beam travels in a path on the disc 104 and as the beam crosses each of the slits 106a and 106b signals are generated. The signals go to a data acquisition system where an image of the current density is created.

The two-slit configuration is an improvement over the prior art because the two concentric slits allow for precise measurement of the beam's velocity knowing the spacing between the slits, while at the same time profiling the beam for computed tomographic analysis. The two-slit configuration with concentric slits allows for beam averaging since more than one data point is acquired for each scan direction.

The description of the structural components of the Applicants' concentric semi-circular slit profiling apparatus 100 illustrated in FIG. 1A and FIG. 1B having been completed, the operation and additional description of the Applicants first embodiment concentric semi-circular slit profiling apparatus, systems, and methods will now be considered in greater detail. The concentric semi-circular slit profiling apparatus 100 has an inner annular slit 106a and an outer annular slit 106b through which the beam passes as it is scanned over the slit disk 104. The inner semi-circular slit 106a and outer semi-circular slit 106b cover about 200 degrees of arc on the circumference, insuring that the centroid of a wide beam can be analyzed over at least 180 deg on the outward scan, and 180 deg on the inward scan. The slits 106a and 106b are made in a disk of a high temperature refractory metal such as tungsten, and the portion of the beam passing through the slit is intercepted by a Faraday cup 110 below the slits 106a and 106b. The acquired signal is processed through the data acquisition system in the same way as for previous embodiments of the modified Faraday cup sensor. There is a hole 130a in the center of the slit disk 104, and a corresponding hole 130b in the Faraday cup holder 116, that allows the beam to pass through the disk and onto a beam stop 120. The beam stop 120 provides a convenient starting and stopping place to rest the beam as it goes through its scanning routine to gather inward and outward scans over the 180 deg semi-annular slit, while distributing excess heat into a location separate from the slit disk. Another embodiment could have the beam stop 120 and associated parts 122, 124, and 132 disconnected from the upper assembly with the beam trap body 116 having its own leveling base 126. This would minimize the heat transfer between the beam stop and the Faraday cup.

Figure 2:
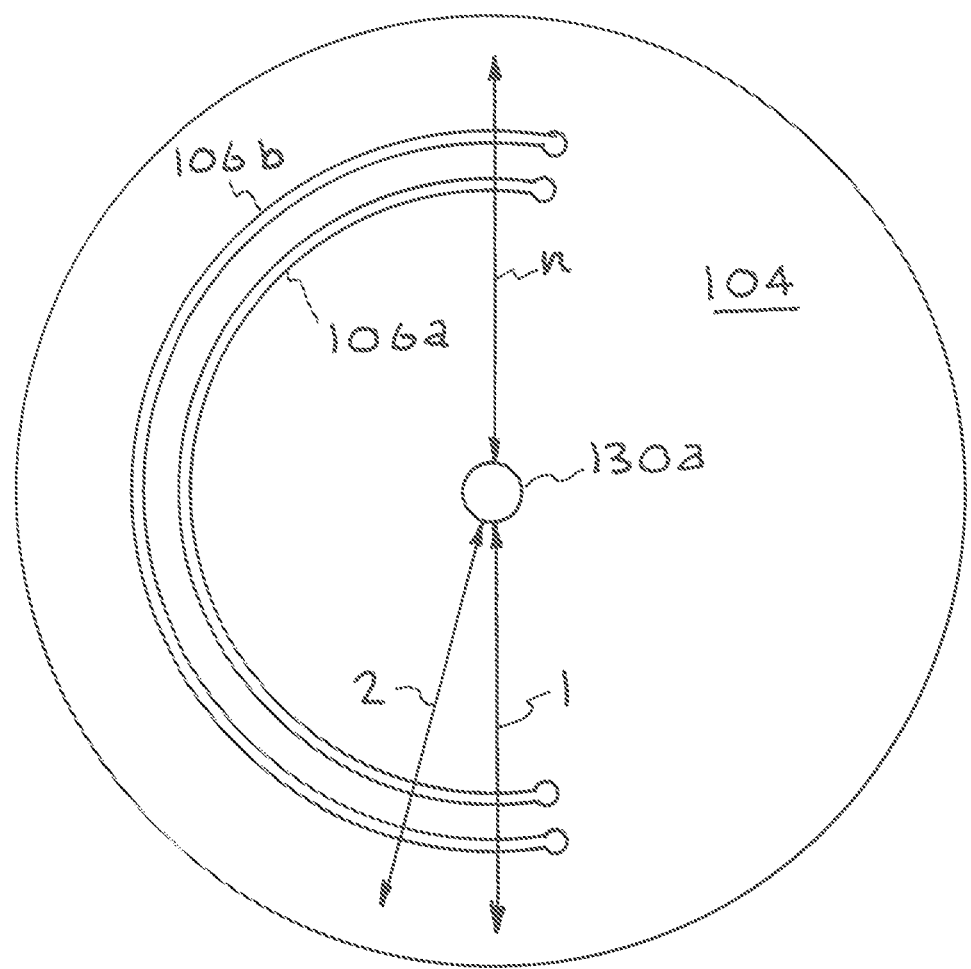
FIG. 2 shows beam scanning patterns.

Referring now to FIG. 2, embodiments of beam scanning patterns used with Applicant's concentric semi-circular slit profiling apparatus 100 are illustrated. The beam scanning patterns are designated by the arrows "1", "2", and "n" in FIG. 2. The inner semi-circular slit 106a and outer semi-circular slit 106b shown in FIG. 2 cover about 200 degrees of arc on the circumference, insuring that the centroid of a wide beam can be analyzed over at least 180 degrees on the outward scan, and 180 degrees on the inward scan. In this pattern, the beam is scanned outward and inward along path 1, then incremented to path 2, etc. Scans are performed to cover the 180 degree semicircular arc range, ending at point "n". Alternate scan patterns may be created that jump around to non-sequential angles for better heat distribution in the slit disk, which will help prevent damage to the slit disk at high powers. The two-slit configuration is an improvement over the prior art because the two concentric slits allow for precise measurement of the beam's velocity knowing the spacing between the slits, while at the same time profiling the beam for computed tomographic analysis. The two-slit configuration with concentric slits allows for beam averaging since more than one data point is acquired for each scan direction.

As the data acquired from slits at equal radii directly across the disk are equivalent the arrangement of slits is not limited to the semicircular design as shown in the illustrated embodiment. The asymmetry in the illustrated embodiment may prove problematic due to thermal expansion at very high powers. A design with rotational symmetry can solve this problem. Any arrangement of odd-numbered pairs of slits can work provided they cover angles equivalent to the semicircular design.

Figure 3A:
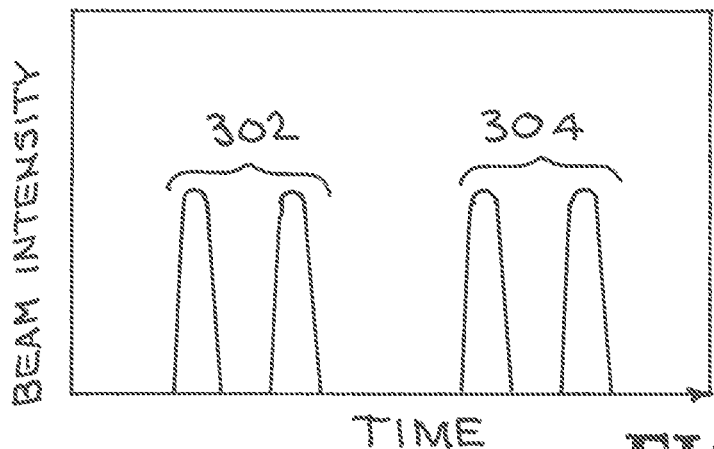
FIGS. 3A, 3B, and 3C are illustrations showing how the data acquired from Applicant's concentric semi-circular slit profiling apparatus is analyzed.
Figure 3B:
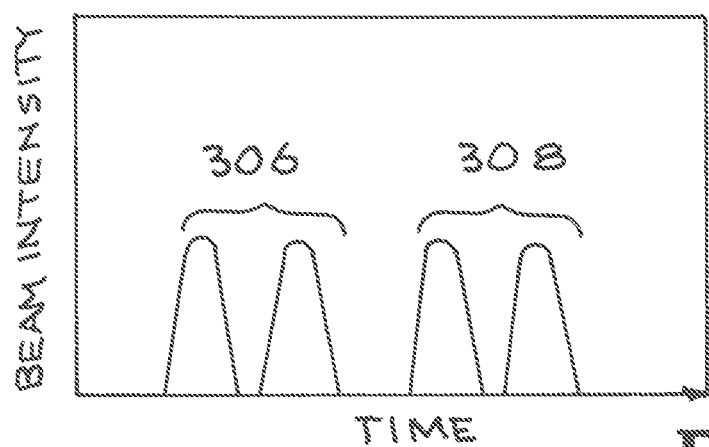
Figure 3C:
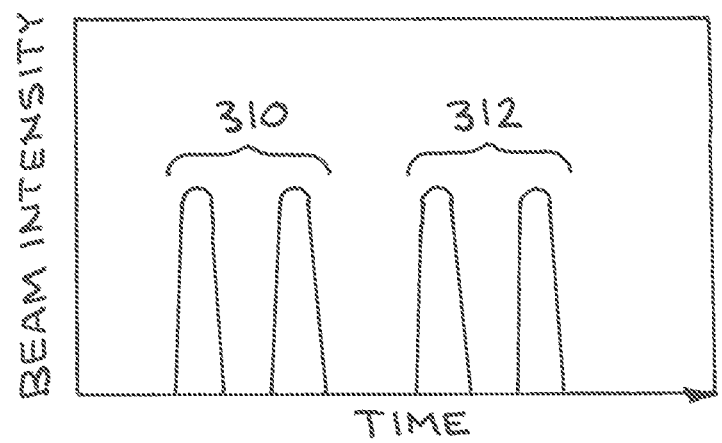

Referring now to FIGS. 3A, 3B, and 3C; illustrations show how the data acquired from Applicant's concentric semi-circular slit profiling apparatus is analyzed. Outward and inward sweeping of the beam over the inner and outer slits provides computed tomography to reconstruct and analyze beam profiles. The outward and inward sweeping of the beam over the slits enables the system to acquire beam profiles both at a given angle going out, and at a second angle when coming back in. FIGS. 3A, 3B, and 3C show that the beam intensity can vary with angle (if the beam is non-symmetric); this is one reason the system should employ as many angles as possible.

The data spikes 302 in FIG. 3A represent the outward scan of the beam as the beam crosses the inner and outer slots of the disk. For example, the beam labeled number 1 in FIG. 2 crosses the inner slot 106a and the outer slot 106b of the disk 104 and produces the data spikes 302. The data spikes 304 in FIG. 3A represent the inward scan of the beam as it again crosses the inner and outer slots of the disk. The beam labeled number 1 in FIG. 2 crosses the outer slot 106b and the inner slot 106a of the disk 104 and produces the data spikes 304.

The data spikes 306 in FIG. 3B represent the outward scan of the beam as the beam crosses the inner and outer slots of the disk. For example, the beam labeled number 2 in FIG. 2 crosses the inner slot 106a and the outer slot 106b of the disk 104 and produces the data spikes 306. The data spikes 308 in FIG. 3B represent the inward scan of the beam as it again crosses the inner and outer slots of the disk. The beam labeled number 2 in FIG. 2 crosses the outer slot 106b and the inner slot 106a of the disk 104 and produces the data spikes 308.

The data spikes 310 in FIG. 3C represent the outward scan of the beam as the beam crosses the inner and outer slots of the disk. For example, the beam labeled "n" in FIG. 2 crosses the inner slot 106a and the outer slot 106b of the disk 104 and produces the data spikes 310. The data spikes 312 in FIG. 3B represent the inward scan of the beam as it again crosses the inner and outer slots of the disk. The beam labeled "n" in FIG. 2 crosses the outer slot 106b and the inner slot 106a of the disk 104 and produces the data spikes 312.

Figure 4:
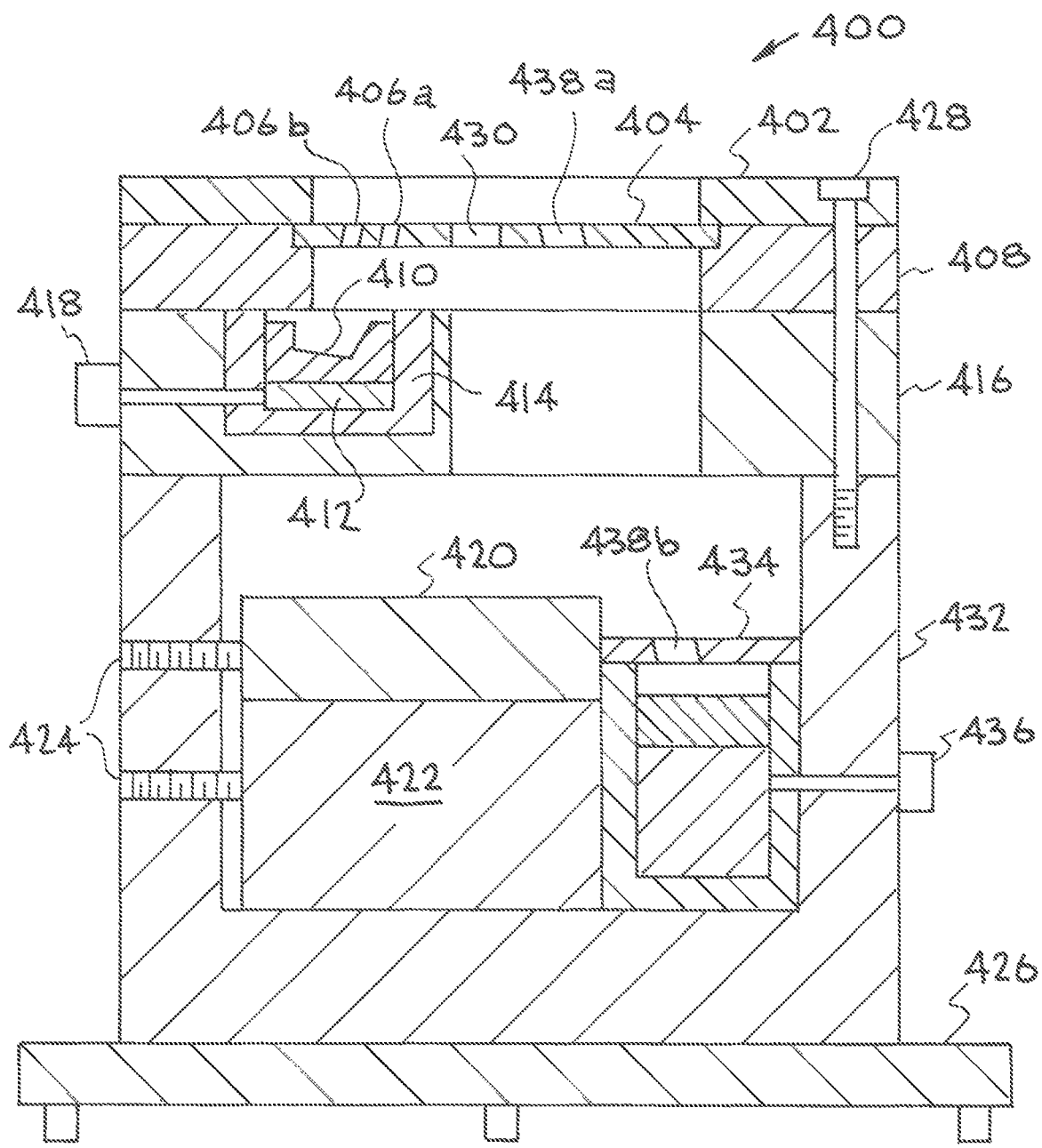
FIG. 4 illustrates another embodiment of Applicants' concentric semi-circular slit profiling apparatus, systems, and methods for computed tomographic imaging of electron beams.

Referring now to FIG. 4, another embodiment of Applicants' concentric semi-circular slit profiling apparatus, systems, and methods for computed tomographic imaging of electron beams is illustrated. This embodiment is designated generally by the reference numeral 400. FIG. 4 is a cross sectional view of Applicants' concentric semi-circular slit profiling apparatus 400.

As illustrated in FIG. 4, the embodiment 400 includes a number of components. The components of the Applicant's concentric semi-circular slit profiling apparatus 400 illustrated in FIG. 4 are identified and described below.

Reference Numeral 402—top clamp,
Reference Numeral 404—slit disk,
Reference Numeral 406a—inner semi-circular slit,
Reference Numeral 406b—outer semi-circular slit,
Reference Numeral 408—slit disk holder,
Reference Numeral 410—faraday cup,
Reference Numeral 412—faraday cup beam stop,
Reference Numeral 414—faraday cup electrical insulator,
Reference Numeral 416—beam trap body,
Reference Numeral 418—insulated electrical connection,
Reference Numeral 420—beam stop absorber.
Reference Numeral 422—beam stop,
Reference Numeral 424—set screws,
Reference Numeral 428—top clamp screws,
Reference Numeral 430—hole in slit disk,
Reference Numeral 432—lower cup body,
Reference Numeral 434—electrically isolated full beam Faraday cup assembly,
Reference Numeral 436—insulated electrical connection,
Reference Numeral 438a—hole in slit disk, and
Reference Numeral 438b—hole in Faraday cup assembly.

The description of the structural components of the Applicants' concentric semi-circular slit profiling apparatus 400 illustrated in FIG. 4 having been completed, the operation and additional description of the Applicants concentric semi-circular slit profiling apparatus, systems, and methods 400 will now be considered in greater detail. FIG. 4 provides a cross sectional view of the electron beam diagnostic annular sensor system 400. There is a lower cup body 432 upon which are mounted the inner ring 416, outer ring 402 and the Faraday cup unit 410. Electrical isolation 418 electrically isolates the Faraday cup unit 410 from the other items. The Faraday cup 410 is where the signal or data is generated and is connected to the data acquisition system. There is an electron beam source connected to an electron beam controller.

The slit disk 404 is a two-slit configuration that includes inner semi-circular slit 406a and outer semi-circular slit 406b. The inner semi-circular slit 430 and outer semi-circular slit 406 cover about 200 degrees of arc on the circumference, insuring that the centroid of a wide beam can be analyzed over at least 180 deg on the outward scan, and 180 deg on the inward scan. There is a hole 433 in the slit disk 404 that allows the beam to pass through the disk and onto the beam stop 422. There is another hole 438*a* in the slit disk 404 allows the beam to pass through the disk and into the electrically isolated full beam Faraday cup assembly 434 through hole 438*b*.

Figure 5:
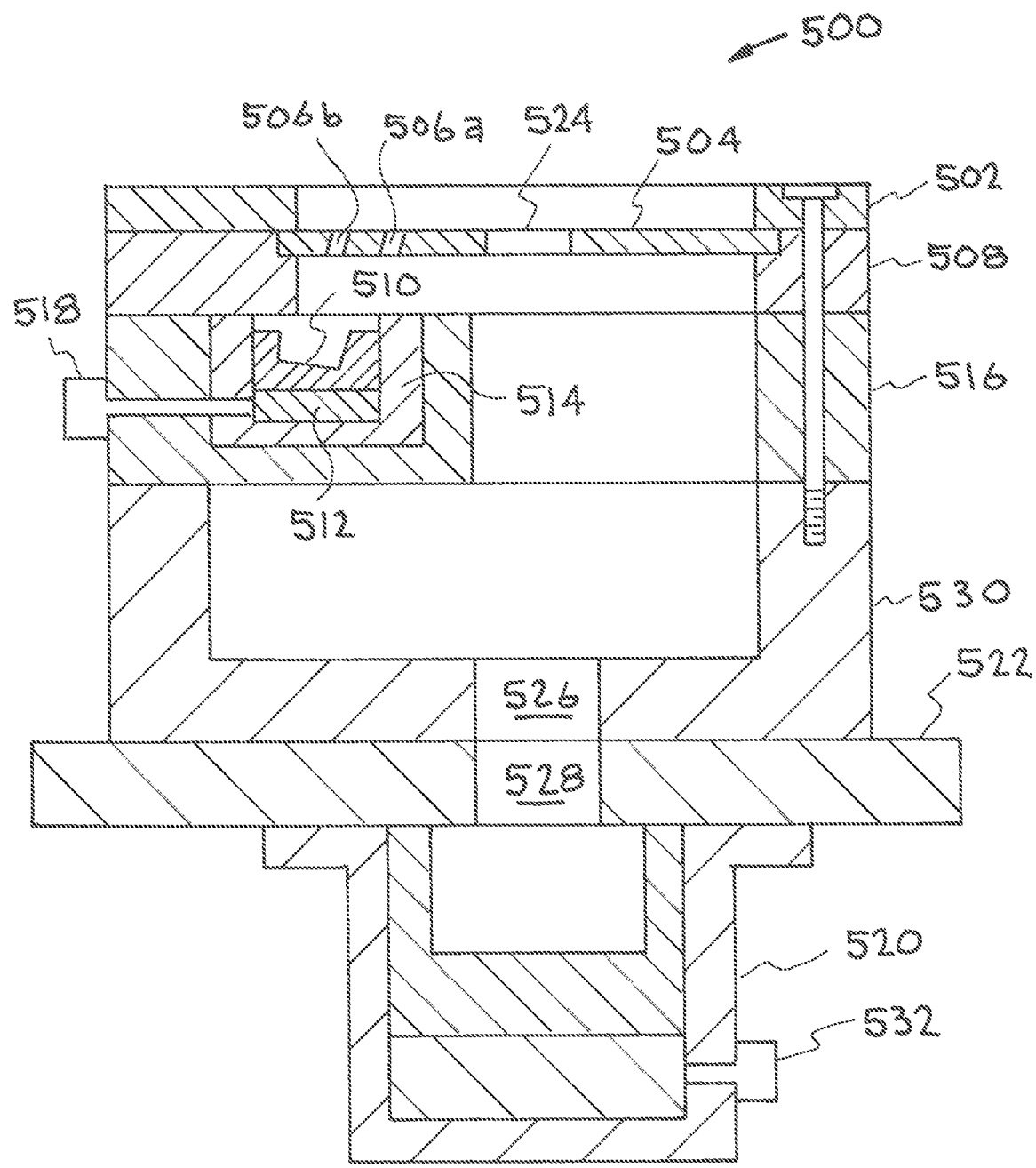
FIG. 5 illustrates yet another embodiment of Applicants' concentric semi-circular slit profiling apparatus, systems, and methods for computed tomographic imaging of electron beams.

Referring now to FIG. 5, yet another embodiment of Applicants' concentric semi-circular slit profiling apparatus, systems, and methods for computed tomographic imaging of electron beams is illustrated. This embodiment is designated generally by the reference numeral 500. FIG. 5 is a cross sectional view of Applicants' concentric semi-circular slit profiling apparatus 500.

As illustrated in FIG. 5, the embodiment 500 includes a number of components. The components of the Applicant's concentric semi-circular slit profiling apparatus 500 illustrated in FIG. 5 are identified and described below.

Reference Numeral 502—top clamp,
Reference Numeral 504—slit disk,
Reference Numeral 506*a*—inner semi-circular slit,
Reference Numeral 506*b*—outer semi-circular slit,
Reference Numeral 508—slit disk holder,
Reference Numeral 510—faraday cup,
Reference Numeral 512—faraday cup beam stop,
Reference Numeral 514—faraday cup electrical insulator,
Reference Numeral 516—beam trap body,
Reference Numeral 518—insulated electrical connection,
Reference Numeral 520—electrically isolated full beam Faraday cup assembly,
Reference Numeral 522—base plate,
Reference Numeral 524—hole,
Reference Numeral 526—hole,
Reference Numeral 528—hole,
Reference Numeral 530—lower cup body, and
Reference Numeral 532—insulated electrical connection.

The description of the structural components of the Applicants' concentric semi-circular slit profiling apparatus 500 illustrated in FIG. 5 having been completed, the operation and additional description of the Applicants concentric semi-circular slit profiling apparatus, systems, and methods 500 will now be considered in greater detail. FIG. 5 provides a cross sectional view of the electron beam diagnostic annular sensor system 500.

The slit disk 504 with inner semi-circular slit 506*a* and outer semi-circular slit 506*b* are held by base plate 522. The Faraday cup unit 510 is positioned to receive the beam as it crosses inner semi-circular slit 506*a* and outer semi-circular slit 506*b*. Electrical isolation 518 electrically isolates the Faraday cup unit 510 from the other items. The Faraday cup 510 is where the signal or data is generated and is connected to the data acquisition system. There is an electron beam source connected to an electron beam controller. There is a hole 524 in the center of the slit disk 504 and holes 526 and 528 that allow the beam to pass onto the electrically isolated full beam Faraday cup assembly 520.

Figure 6:
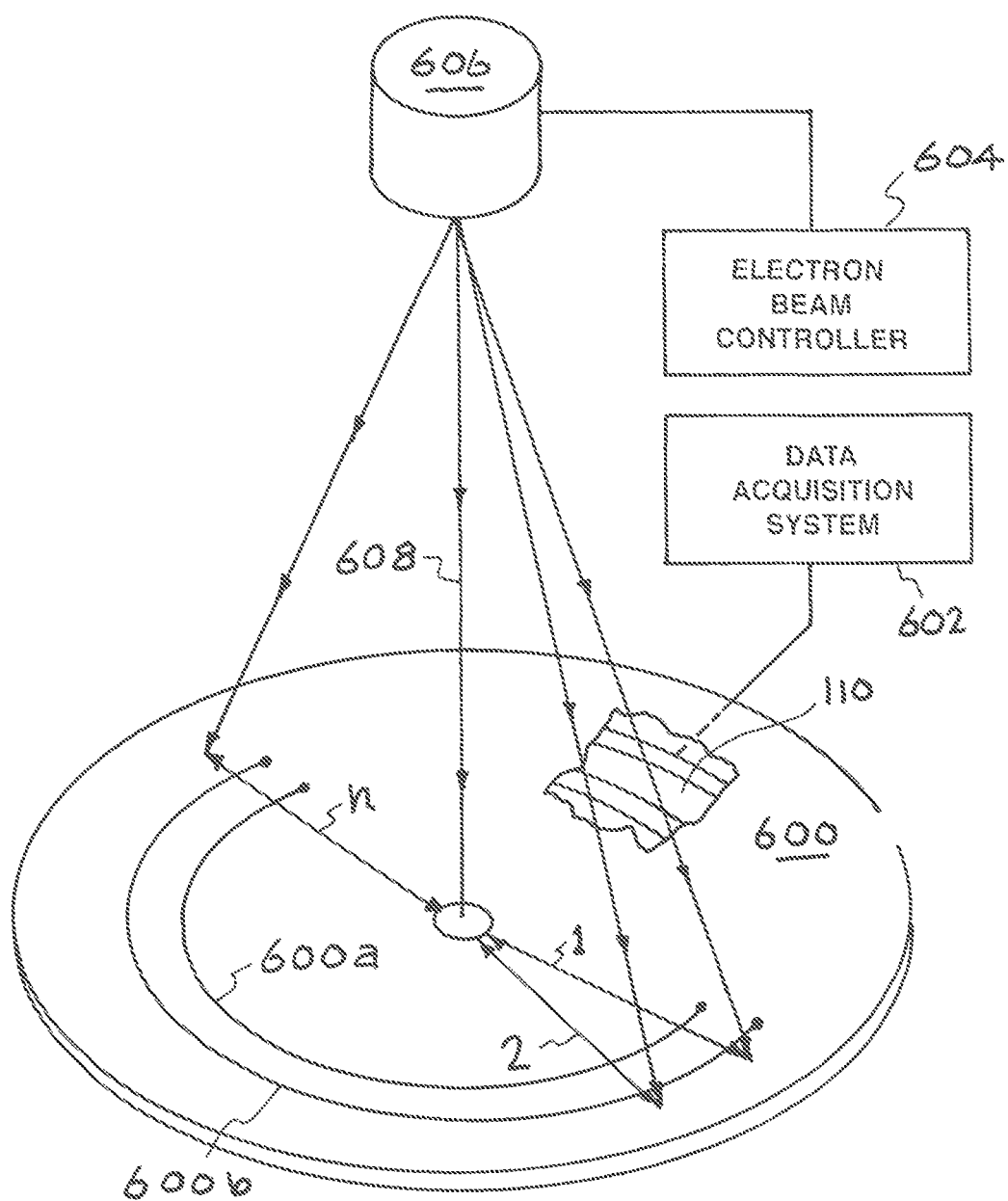
FIG. 6 is a diagram that illustrates various factors used to generate the computer tomographically constructed beam profiles.

Referring now to FIG. 6, an illustration shows various factors that are used in Applicant's concentric semi-circular slit profiling apparatus to generate a computer tomographically constructed beam profile. A slit disk 600 with inner slit 600*a* and outer slit 600*b* is shown connected to a data acquisition system 602. A portion of the slit disk 600 is cut away in FIG. 6 showing that that the signal comes from the Faraday cup 110 below the slit disk and is directed to the data acquisition system 602.

An electron beam controller 604 is connected to an electron beam source 606. The electron beam source 606 produces electron beam 608. The electron beam controller 604 sweeps the electron beam 608 across the slit disk 600 in a manner that utilizes various factors to generate computer tomographically constructed beam profiles. The beam 608 is scanned outward and inward along path 1, then incremented to path 2, etc. Scans are performed to cover the 180 degree semicircular arc range, ending at point "n".

Figure 7:
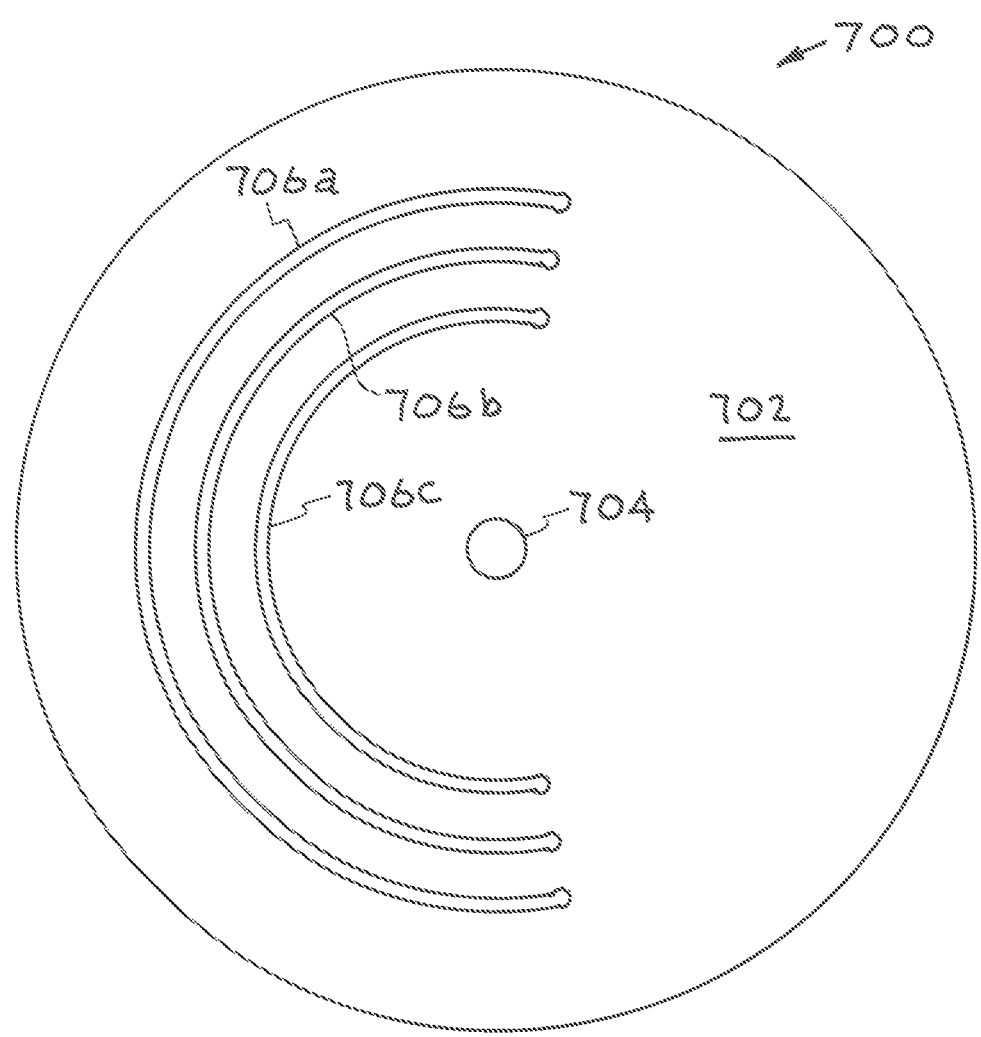
FIG. 7 is a top view of a concentric semi-circular slit profiling apparatus that has slit disk including three semi-circular slits.

Referring now to FIG. 7, a top view of a concentric semi-circular slit profiling apparatus 700 that has slit disk 702 including three semi-circular slits. The slit disk 702 can be mounted in Applicants' concentric semi-circular slit profiling apparatus 100 shown in FIG. 1A replacing the two slit disk 104 illustrated in FIG. 1B.

The concentric semi-circular slit profiling apparatus 700 has a first annular slit 706*a*, a second annular slit 706*b*, and a third annular slit 706*c* through which the beam passes as it is scanned over the slit disk 702. Each of the three semi-circular slits cover about 200 degrees of arc on the circumference, insuring that the centroid of a wide beam can be analyzed over at least 180 deg on the outward scan, and 180 deg on the inward scan. There is a hole 704 in the center of the slit disk 702 that allows the beam to pass through the disk and onto the beam stop. The operation of Applicant's concentric semi-circular slit profiling apparatus 700 is the same as the operation of the concentric semi-circular slit profiling apparatus 100 shown in FIG. 1A.

The three-slit configuration is an improvement over the prior art because the three concentric slits allow for precise measurement of the beam's velocity knowing the spacing between the slits, while at the same time profiling the beam for computed tomographic analysis. The three-slit configuration with concentric slits allows for beam averaging since more than one data point is acquired for each scan direction.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:

1. An apparatus for analyzing an electron beam, comprising:
    a circular sensor disk adapted to receive the electron beam, said circular sensor disk having a central axis;
    an inner semi-circular slit in said circular sensor disk wherein said inner semi-circular slit extends at least 180 degrees of arc with respect to said central axis of said circular sensor disk;
    an outer semi-circular slit in said circular sensor disk wherein said outer semi-circular slit extends at least 180 degrees of arc with respect to said central axis of said circular sensor disk and wherein said outer semi-circular slit is spaced from said first semi-circular slit by a fixed distance;
    a system for sweeping the electron beam radially outward from said central axis to said inner semi-circular slit and outer second semi-circular slit;
    a sensor structure operatively connected to said circular sensor disk wherein said sensor structure receives the electron beam when it passes over said inner semi-circular slit and said outer semi-circular slit; and
    a device for measuring the electron beam that is intercepted by said inner semi-circular slit and said outer semi-circular slit.

2. The apparatus for analyzing an electron beam of claim 1
    wherein said inner semi-circular slit in said circular sensor disk extends more than 180 degrees of arc with respect to said central axis of said circular sensor disk but less than 360 degrees of arc with respect to said central axis of said circular sensor disk and
    wherein said outer semi-circular slit in said circular sensor disk extends more than 180 degrees of arc with respect to said central axis of said circular sensor disk but less than 360 degrees of arc with respect to said central axis of said circular sensor disk.

3. The apparatus for analyzing an electron beam of claim 2 wherein said device for measuring the electron beam that is intercepted by said inner semi-circular slit and said outer semi-circular slit includes a Faraday cup.

4. The apparatus for analyzing an electron beam of claim 3 wherein said Faraday cup is an annular ring that extends around said central axis.

5. The apparatus for analyzing an electron beam of claim 3 wherein said Faraday cup is an annular ring that extends around said central axis and is located beneath said circular sensor disk.

6. The apparatus for analyzing an electron beam of claim 3 wherein said Faraday cup is a partial annular ring that extends more than 180 degrees of arc with respect to said central axis of said circular sensor disk but less than 360 degrees of arc with respect to said central axis.

7. The apparatus for analyzing an electron beam of claim 3 wherein said Faraday cup is a partial annular ring that extends more than 180 degrees of arc with respect to said central axis of said circular sensor disk but less than 360 degrees of arc with respect to said central axis and is located beneath said inner semi-circular slit and said outer semi-circular slit.

8. The apparatus for analyzing an electron beam of claim 1 further comprising
    a central hole in said circular sensor disk that receives the electron beam and
    a beam stop beneath said central hole in said circular sensor disk wherein said beam stop receives the electron beam that passes through said central hole in said circular sensor disk.

9. The apparatus for analyzing an electron beam of claim 1 further comprising
    a hole in said circular sensor disk that receives the electron beam and
    a Faraday cup device for measuring the electron beam beneath said hole in said circular sensor disk wherein said Faraday cup device receives the electron beam that passes through said hole in said circular sensor disk.

10. The apparatus for analyzing an electron beam of claim 9 wherein said Faraday cup device is located beneath said hole in said circular sensor disk and is aligned with said central axis of said circular sensor disk.

11. The apparatus for analyzing an electron beam of claim 9 wherein said Faraday cup device is located beneath said hole in said circular sensor disk and is offset from said central axis of said circular sensor disk.

12. The apparatus for analyzing an electron beam of claim 1 further comprising an additional semi-circular slit in said circular sensor disk wherein said additional semi-circular slit extends more than 180 degrees of arc with respect to said central axis of said circular sensor disk but less than 360 degrees of arc with respect to said central axis of said circular sensor disk.

13. The apparatus for analyzing an electron beam of claim 1
    wherein said inner semi-circular slit in said circular sensor disk extends more than 180 degrees of arc with respect to said central axis of said circular sensor disk but less than 200 degrees of arc with respect to said central axis of said circular sensor disk and
    wherein said outer semi-circular slit in said circular sensor disk extends more than 180 degrees of arc with respect to said central axis of said circular sensor disk but less than 200 degrees of arc with respect to said central axis of said circular sensor disk.

14. An apparatus for analyzing an electron beam, comprising:
    circular sensor disk means for receiving the electron beam, said circular sensor disk means having a central axis;

an inner semi-circular slit in said circular sensor disk means wherein said inner semi-circular slit extends more than 180 degrees of arc with respect to said central axis of said circular sensor disk means but less than 360 degrees of arc with respect to said central axis of said circular sensor disk means;

an outer semi-circular slit in said circular sensor disk means wherein said outer semi-circular slit extends more than 180 degrees of arc with respect to said central axis of said circular sensor disk means but less than 360 degrees of arc with respect to said central axis of said circular sensor disk means and wherein said outer semi-circular slit is spaced from said first semi-circular slit by a fixed distance;

a system for sweeping the electron beam radially outward from said central axis to said inner semi-circular slit and outer second semi-circular slit;

a sensor structure operatively connected to said circular sensor disk means wherein said sensor structure receives the electron beam when it passes over said inner semi-circular slit and said outer semi-circular slit; and a device for measuring the electron beam that is intercepted by said inner semi-circular slit and said outer semi-circular slit.

15. The apparatus for analyzing an electron beam of claim 14 wherein said inner semi-circular slit in said circular sensor disk means extends more than 180 degrees of arc with respect to said central axis of said circular sensor disk but less than 200 degrees of arc with respect to said central axis of said circular sensor disk and wherein said outer semi-circular slit in said circular sensor disk means extends more than 180 degrees of arc with respect to said central axis of said circular sensor disk but less than 200 degrees of arc with respect to said central axis of said circular sensor disk.

16. The apparatus for analyzing an electron beam of claim 14 further comprising an additional semi-circular slit in said circular sensor disk means wherein said additional semi-circular slit extends more than 180 degrees of arc with respect to said central axis of said circular sensor disk but less than 360 degrees of arc with respect to said central axis of said circular sensor disk.

17. A method of analyzing an electron beam, comprising the steps of:

providing a circular sensor adapted to receive the electron beam, said circular electron beam diagnostic sensor having a central axis;

providing an inner semi-circular slit in said circular sensor disk wherein said inner semi-circular slit extends more than 180 degrees of arc with respect to said central axis of said circular sensor disk but less than 360 degrees of arc with respect to said central axis of said circular sensor disk;

providing an outer semi-circular slit in said circular sensor disk wherein said second semi-circular slit extends more than 180 degrees of arc with respect to said central axis of said circular sensor disk but less than 360 degrees of arc with respect to said central axis of said circular sensor disk and wherein said second semi-circular slit is spaced from said first semi-circular slit by a fixed distance;

sweeping the electron beam radially outward from said central axis to said inner semi-circular slit and said outer semi-circular slit;

using a sensor structure operatively connected to said circular sensor disk to receive the electron beam when it passes over said inner semi-circular slit and said outer semi-circular slit; and measuring the electron beam that is intercepted by said inner semi-circular slit and said outer semi-circular slit.

18. The method of analyzing an electron beam of claim 17 wherein said step of providing a circular sensor adapted to receive the electron beam comprises providing a circular sensor Faraday cup adapted to receive the electron beam.

19. The method of analyzing an electron beam of claim 17 further comprising the step of providing a central hole in said circular sensor disk that receives the electron beam and providing a beam stop beneath said central hole in said circular sensor disk wherein said beam stop receives the electron beam that passes through said hole in said circular sensor disk.

20. The method of analyzing an electron beam of claim 17 further comprising the step of providing a hole in said circular sensor disk that receives the electron beam and providing a Faraday cup device beneath said hole in said circular sensor disk wherein said Faraday cup device receives the electron beam that passes through said hole in said circular sensor disk.

21. The method of analyzing an electron beam of claim 20 wherein said step of providing a Faraday cup device beneath said hole in said circular sensor disk wherein said Faraday cup device is located beneath said hole in said circular sensor disk and is aligned with said central axis of said circular sensor disk.

22. The method of analyzing an electron beam of claim 20 wherein said step of providing a Faraday cup device beneath said hole in said circular sensor disk wherein said Faraday cup device is located beneath said hole in said circular sensor disk and is offset from said central axis of said circular sensor disk.

23. The method for analyzing an electron beam of claim 17 wherein said step of providing an inner semi-circular slit in said circular sensor disk comprises providing an inner semi-circular slit in said circular sensor disk that extends more than 180 degrees of arc with respect to said central axis of said circular sensor disk but less than 200 degrees of arc with respect to said central axis of said circular sensor disk and wherein said step of providing an outer semi-circular slit in said circular sensor disk comprises providing an outer semi-circular slit in said circular sensor disk that extends more than 180 degrees of arc with respect to said central axis of said circular sensor disk but less than 200 degrees of arc with respect to said central axis of said circular sensor disk.

\* \* \* \* \*